(12) United States Patent
Brubaker

(10) Patent No.: US 7,375,671 B1
(45) Date of Patent: May 20, 2008

(54) SYSTEMS AND METHODS FOR REDUCING TRANSIENT ERRORS ON DIGITAL TO ANALOG CONVERTERS (DACS) DEGLITCHER

(75) Inventor: James Lee Brubaker, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/671,646

(22) Filed: Feb. 6, 2007

(51) Int. Cl.
*H03M 1/66* (2006.01)

(52) U.S. Cl. .................. 341/145; 341/118; 341/136; 341/144

(58) Field of Classification Search .......... 341/145
See application file for complete search history.

(56) References Cited

U.S. PATENT DOCUMENTS

| | | | | |
|---|---|---|---|---|
| 6,218,974 B1 * | 4/2001 | Dedic | ............. | 341/144 |
| 6,392,573 B1 * | 5/2002 | Volk | ............. | 341/118 |
| 6,628,219 B2 * | 9/2003 | Dedic | ............. | 341/144 |
| 6,650,265 B1 * | 11/2003 | Bugeja | ............. | 341/144 |
| 6,853,322 B2 * | 2/2005 | Dedic | ............. | 341/144 |
| 6,906,652 B2 * | 6/2005 | Bugeja | ............. | 341/145 |
| 7,034,733 B2 * | 4/2006 | Dedic et al. | ............. | 341/150 |

* cited by examiner

*Primary Examiner*—Khai M Nguyen
(74) *Attorney, Agent, or Firm*—McDermott Will & Emery LLP

(57) ABSTRACT

A digital to analog converter that receives a digital signal and that converts the digital signal to an analog input signal is provided. The converter may include a group of most significant bits. The group is decoded to drive a plurality of equivalent most significant segments. The converter may also include a second group of bits. The second group is decoded to drive a second plurality of equivalent segments.

18 Claims, 3 Drawing Sheets

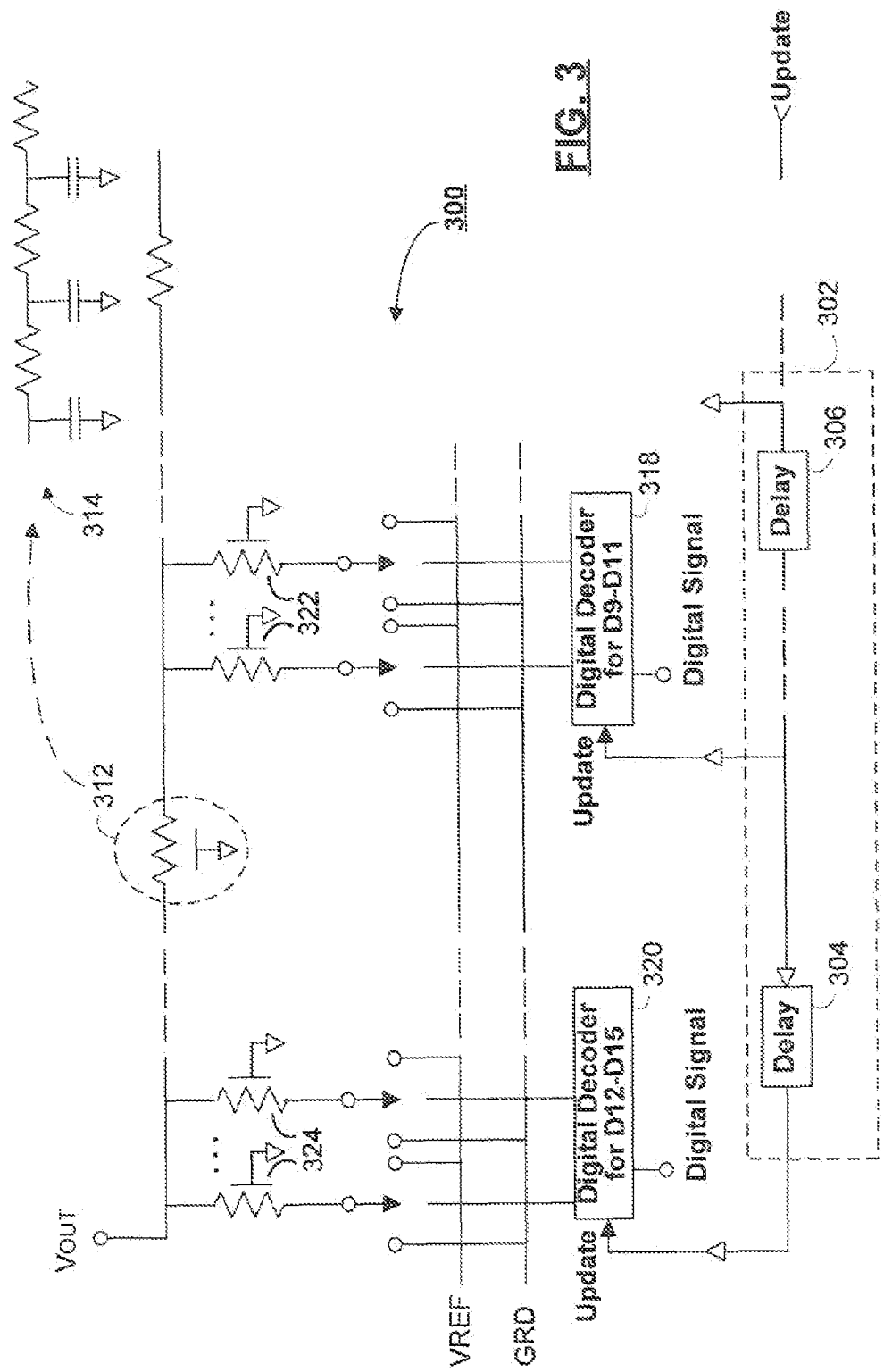

SYSTEMS AND METHODS FOR REDUCING TRANSIENT ERRORS ON DIGITAL TO ANALOG CONVERTERS (DACS) DEGLITCHER

BACKGROUND OF THE INVENTION

Purpose of the subject matter of the disclosure:

The purpose of the invention is to reduce transient errors, such as glitch impulse, in digitally switched circuits, such as resistive ladder Vout Digital to Analog Converters (DACs). In particular, this invention relates to circuits in which various switches have different analog propagation delays to the output, thereby causing transient errors.

PRIOR ART

To better understand this problem as it occurs in DACs, a short introduction to DACs will be presented. Then, the relationship between the problem stated above and DACs will be discussed.

DACs translate binary signals from computers or other discrete circuitry into proportional analog voltage levels. DACs are commonly used to drive analog devices such as meters, motor controllers, or audio circuitry.

The binary weighted resistor network DAC is a simple method of converting digital bits from a digital signal into an analog signal. For the circuit 100 shown in FIG. 1, a binary signal is applied to gating circuits 118 that drive analog switches 102, 104, 106 and 108. When a binary signal of 0000 is applied17 to the switches, all the switches are open so no voltage is applied to the op amp 122. At this point, the output is 0 volts. When a 0001 binary signal is applied, switch 102 closes and —10 volts is applied to resistor 110. Because the input of op amp 122 represents virtual ground, there is 10 volts across the 8000 ohm resistor 110. That cause 10 V/8000 ohm, or 1.25 milliamps, to flow through the 800 ohm feedback resistor 120. By Ohm's law, the voltage across resistor 120 would be 800 ohm×1.25 milliamps, or 1 volt.

When the binary signal changes to 0010, switch 102 opens and switch 104 closes. The causes 2.5 milliamp (10 volts/4000 ohms) to flow through resistor 120. The voltage across resistor 120 is then 800 ohms×2.5 milliamps, or 2 volts. A binary 0100 would create 4 volts at the output, and so on.

A binary-weighted resistor network DAC is not practical, however, for applications requiring much more than 4 bits of resolution because the range of resistor values required is very large and difficult to fabricate accurately. A R 2R ladder network has become the DAC of choice, therefore, in most applications.

The R 2R ladder network is capable of producing binary weighted voltages with resistors having only two different values of resistance arranged in a type of network known as a binary ladder, shown in FIG. 2. In this circuit, a series of latches 240 are used to drive analog switches 202, 204, 206 and 208.

The R 2R ladder operates such that, when an individual switch is closed, each "rung" on the R 2R ladder delivers a current to the virtual ground node. Because of the arrangement of resistors 210, 212, 214, 216, 218, 220, 222 and 224, the current delivered by each successive rung is binarily weighted. Thus, each successive switch going down the ladder, when connected to VREF, produces a current, which, in turn, produces half the output voltage of the switch above it.

For example, when a binary 0000 is transmitted to latches 240, this connects all of the switches to ground and disconnects VREF from the output. This causes 0 volts to appear at the output of the op amp 230. A binary signal of 1000 will connect switch 202, thus activating the MSB (most significant bit). By Ohm's law, the current flowing through resistor 210 will cause a signal to appear at the output. A signal of 0100 open switch 202 and connects switch 204 to VREF and results in a −VREF/2 volt signal at the output.

The primary advantage of the binary-weighted ladder design over the resistor network DAC is its use of resistors having only two resistor values. As a result, it is a simple matter to process virtually any number of bits simply by adding additional "rungs" to the ladder.

In resistor ladder DACs operating in the voltage switching (VOUT) mode, different bits have different propagation delays through the resistor ladder to the output. These different propagation delays typically create large major carry glitch impulse errors. A major carry occurs when an MSB (most significant bit) is turned OFF and all the LSBs (less significant bits) are turned ON.

To reduce this effect, it is conventional to segment the (4) most significant bits of a 16-bit DAC into (15) equally weighted segments, all of which have about the same propagation delay to the output. These 15 equally weighted bits are commonly referred to as thermometer coded as opposed to binary-encoded because a four-bit thermometer code has fifteen distinct transitions representing the sixteen possible values of a four-bit input, i.e., from 0000 to 1111. These bits do not require resistors between successive segments because they provide sequentially weighted signals and not binarily weighted signals. Any number of the bits in the DAC can be thermometer-encoded.

Another prior art method to reduce the glitch impulse is to add a sample and hold or track and hold circuit after the DAC.

PROBLEMS OF PRIOR ART

Glitch impulse is still significant after segmenting the (4) MSB's into 15 equally weighted segments, and it is one-sided—i.e., it is typically a substantially positive glitch impulse—i.e., net over a base-line signal—or some substantially negative glitch impulse—i.e., net under a base-line signal. As such it cannot be easily filtered out. For a 2.5V Full Scale Range, the weight of the lower, unsegmented bits is FS/16=156 mV. An average difference in delay of 40 to 60 nanoseconds from the lower bits to the output with respect to the upper, segmented bits to the output produces the 7 to 10 nanovolt-second glitch impulse known as typical in prior art products.

Adding a sample and hold or track and hold circuit adds considerably to cost, power and area, and is likely to degrade offset, linearity, gain error, settling time, etc.

Therefore, it would be desirable to provide improved deglitching circuits that reduce the average difference in delay between the upper bits of a DAC and the lower bits of a DAC.

It would also be desirable to provide improved deglitching circuits that do not add substantially to the cost, power consumption and/or areas of the existing circuitry.

SUMMARY OF THE INVENTION

It is an object of the invention to provide improved deglitching circuits that reduce the average difference in delay between the upper bits of a DAC and the lower bits of a DAC.

It is a further object of the invention to provide improved deglitching circuits that do not add substantially to the cost, power consumption and/or area of the existing circuitry.

A digital to analog converter that receives a digital signal and that converts the digital signal to an analog input signal is provided. The converter may include a group of most significant bits. The group is decoded to drive a plurality of equivalent most significant segments. The converter may also include a second group of bits. The second group is decoded to drive a second plurality of equivalent segments.

In another aspect of the invention, the invention may also include a clock delay circuit. The clock delay circuit may provide digital input signals to the group of most significant bits and the second group of bits. The clock delay circuit may delay the update of the digital input signals to the most significant bits in order to compensate for an analog propagation delay from the switches associated with the second group of bits relative to an analog propagation delay from the switches associated with the propagation delay from the most significant bits.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein:

FIG. 3 is a schematic diagram of a digital-to-analog converter according to the principles of the invention.

DETAILED DESCRIPTION OF THE INVENTION

Figure 1:
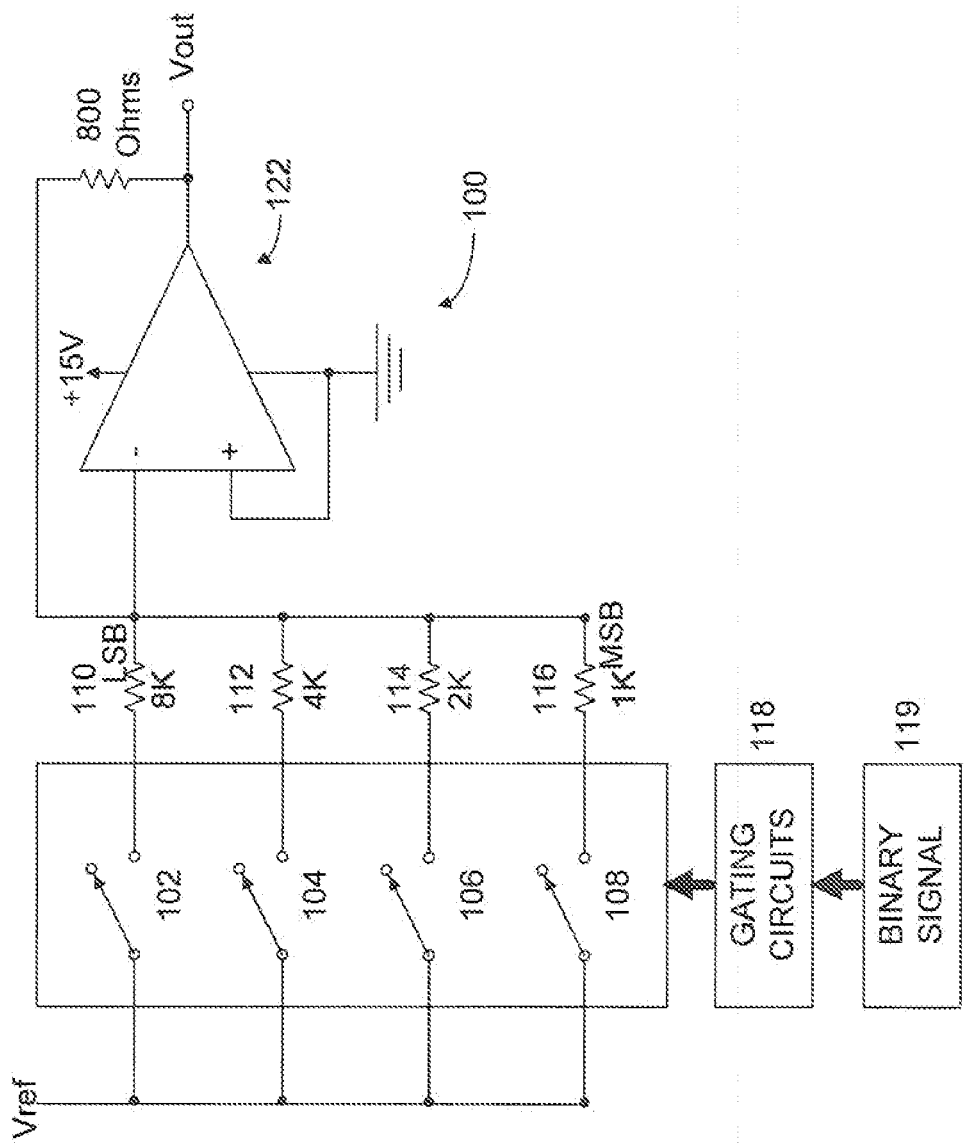
FIG. 1 is a circuit diagram of a conventional binary weighted resistor-network DAC.
Figure 2:
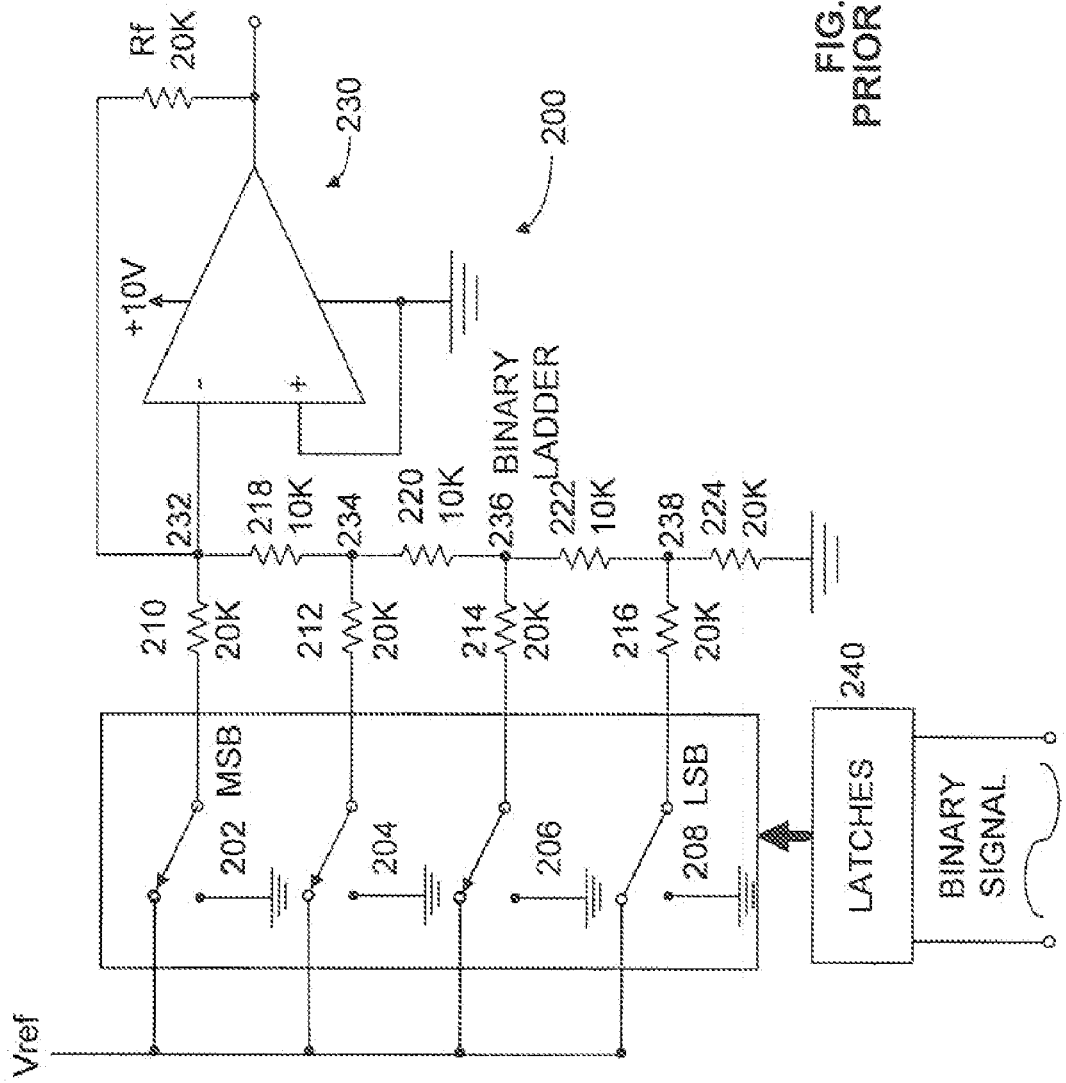
FIG. 2 is a circuit diagram of a conventional R-2R ladder-network DAC.

Using the proposed circuit techniques in the same embodiment as described in more detail below, the circuit according to the invention may have a glitch impulse of substantially less than the prior art. For example, a circuit according to the invention may exhibit a glitch impulse of between 0.5 to 1 nV-sec. Also, any glitch preferably has nearly equal positive and negative components, so it can filter out easily, and does not produce significant distortion. Based on the symmetry of positive and negative components, the average different in delay to the output from the lower bits with respect to the upper bits appears to be <1 ns instead of +40 nanoseconds. This preferably obtains cleaner appearing transients, and lower distortion.

Furthermore, the additional chip layout area required for the proposed circuit is minimal.

DESCRIPTION OF OPERATION

FIG. 3 shows the "CLKDEL", or Clock Delay circuit 302 that may be used in DAC 300 according to the invention.

The CLKDEL preferably controls the update of the DAC in a digital "Track and Hold" fashion as follows. Alternatively, CLKDEL could control the update of the DAC in another suitable fashion such as adding updatable latches in the decoder.

Following the rising edge of an incoming digital signal (when the DAC is to be updated) all of the signals first from delay circuits 304, 306 . . . preferably go to a state the blocks the propagation of the digital input signals into the DAC switch drivers. This blocking preferably occurs before the digital circuits (that are providing the input digital signal) have changed state. After the initial delay to ensure that the digital inputs have reached their new value, the CLKDEL control outputs from delay circuits 304, 306 begin to enable the propagation of the new DAC digital input signals to the DAC switches 308, 310 etc.

The first signal to be generated, referred to herein as a "TRKH" signal, may enable the update of (9) LSB's (not shown even partially). These bits may be referred to herein as DAC D0 to D8 in a 16-bit digital-to-analog converter according to the invention. Preferably less than some predetermined time (such as in the magnitude of tens of nanoseconds (ns)) later, the signals from delay circuit 306 go high, which enables the update of second set of DAC bits D9, D10 and D11 [shown representatively in a simplified drawing for purposes of illustration as subDAC 322]. These bits may be decoded to drive (7) equivalent segments, each preferably having an equal, 512 LSB weight. This decoding scheme may be referred to as being thermometer-coded, as described in more detail above.

In this exemplary embodiment of the invention, some predetermined time later, the signals from delay circuit 304 go high, which enables the update of the DAC MSBs D12, D13, D14 and D15 (shown representatively in a simplified drawing for purposes of illustration as subDAC 324). These bits are decoded to drive (15) segments, each having an equal 4096 LSB weight. It should be noted that, although the circuit is shown in FIG. 3 as having the delay implemented before digital decoders 318 and 320, the delay may also be implemented in the digital decoder outputs, though this may require additional circuitry. Furthermore, circuits 322 and 324 are shown to schematically represent preferably equivalent weighted segments of segmented subDACs.

In this preferred embodiment of the invention, the delay between delay circuit 306 signal rise times and delay circuit 304 signal rise times can be designed to be about equal to the added analog propagation delay from the switches of subDAC 322 to the output relative to the propagation delay from the switches of subDAC 324.

Similarly, the delay between the TRKH signal which enables the nine LSB signals, and the signals from delay circuit 306 rise times can be designed to be substantially equal to the added analog propagation delay from the LSB switches to the output relative to the propagation delay from the switches of subDAC 322.

It should be noted that in one embodiment of the invention, the analog signal delays in the DAC resistor ladder can be predominantly distributed RC delays through the relatively long thin film resistors. This can be seen, for example, in resistor 312 which schematically represents RC circuit 314.

In one embodiment of the invention, the relative output delays can be designed to be dominated by distributed RC delays through long thin film resistors having the same width as the DAC ladder unit resistors 312.

One preferred embodiment of the invention uses a ladder architecture in which groups of lower bits, such as the nine LSBs set forth above, are decoded to drive equally-weighted segments as opposed to the traditional prior art architecture which uses a binary-weighted R-2R ladder architecture below the (4) segmented MSBs. This embodiment of the invention has at least one advantage of reducing the number of different delayed digital update signals required. For example, in such a circuit, only the following delay circuits may be used—one between the group of lower bits and the group of middle bits, and one between the group of middle bits and the group of most significant bits.

One further advantage of the aforementioned architecture—i.e., where all bits are grouped into a small number of groups such as these groups—is the increased flexibility the architecture offers to optimize the fundamental tradeoff between analog delay times vs. worst case (low) Vref impedance. One of the major drawbacks shared by all voltage switching resistor ladder DACs is the large variation in R(Vref) and I(Vref), which may be obtained using a complicated function of the digital input code.

In one embodiment, the DAC according to the invention preferably uses a fully segmented architecture: a group of the most significant bits—i.e., D14, D14, D13 and D12 (none of these are shown in their individual capacity in FIG. 3)—are decoded to drive fifteen (15) segments, each having a weight of 4096 LSBs. A group of less significant bits—i.e., D11, D10, and D9—are decoded to drive seven (7) segments, each having a weight of 512 LSBs. A group of still less significant bits—i.e., D8, D7, and D6—are decoded to drive seven (7) segments, each having a weight of 64 LSBs. A group of yet less significant bits—i.e., D5, D4, and D3—are decoded to drive seven (7) segments, each having a weight of 8 LSBs. Finally, a group of the least significant bits—i.e., D2, D1, and D0—are decoded to drive seven (7) segments, each having a weight of 1 LSB.

An alternate embodiment of the invention is to use the traditional R-2R binary-weighted architecture for some or all of the bits. This approach may require more delay control signals to achieve comparable glitch reduction at least because each bit in an R-2R ladder structure may have a different propagation delay to the output. A possible advantage of this approach may be to reduce circuit complexity.

The embodiments described hereinabove are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A digital to analog converter that receives a digital signal, the digital signal comprising a plurality of bits, and that converts the digital signal to an analog output signal, the plurality of bits comprising:
   a group of most significant bits, wherein the group is decoded to drive a plurality of equivalent most significant segments; and
   a second group of bits, wherein the second group is decoded to drive a second plurality of equivalent segments; and
   a clock delay circuit, the clock delay circuit that is adapted to delay at least in part the update of the digital input signal by an amount of time about equal to the difference between an analog propagation delay associated with switches that receive the second group of bits relative to an analog propagation delay associated with switches that receive the most significant bits.

2. The converter of claim 1 wherein each of the second plurality of segments comprises a weight with respect to the analog output signal that is less than a weight of each of the most significant segments with respect to the analog output signal.

3. The converter of claim 1 further comprising a third group of bits, wherein the third group of bits is decoded to drive a third plurality of equivalent segments, each of the third plurality of segments comprising a weight with respect to the analog output signal that is less than a weight with respect to the output signal of each of the second plurality of segments.

4. The digital to analog converter of claim 3 further comprising a fourth group of bits, wherein the fourth group of bits is decoded to drive a fourth plurality of equivalent segments, each of the fourth plurality of segments comprising a weight with respect to the analog output signal that is less than a weight of each of the third plurality of segments.

5. The digital to analog converter of claim 1 further comprising a fourth group of bits, the fourth group of bits comprising a binary R-2R resistor ladder.

6. The digital to analog converter of claim 1, the clock delay circuit that delays the update of the digital input signals to the most significant bits by about an amount of time that substantially compensates for a difference between the analog propagation delay from the switches associated with the second group of bits relative to an analog propagation delay from the switches associated with the propagation delay from the most significant bits.

7. A clock delay circuit that provides digital input signals to a digital to analog converter circuit, the clock delay circuit that is adapted to:
   drive a plurality of most significant equivalent segments of the digital to analog converter circuit; and
   drive a second plurality of equivalent segments of the digital to analog converter circuit, the driving the plurality of most significant equivalent segments occurring following a predetermined delay after the driving of the second plurality of equivalent segments.

8. The clock delay circuit of claim 7, further adapted to drive a third plurality of equivalent segments of the digital to analog converter circuit, the driving the second plurality occurring following a delay after the driving of the third plurality of equivalent segments.

9. The clock delay of claim 8, further adapted to drive a fourth plurality of equivalent segments.

10. The clock delay circuit of claim 7, further adapted to drive a binary 1R-2R resistor ladder.

11. A clock delay circuit that controls the propagation of digital input signals to a digital to analog converter, the clock delay circuit comprising:
   a first group of output signals that is decoded to drive a plurality of equivalent most significant segments;
   a second group of output signals that is decoded to drive a second plurality of equivalent segments; and
   a third group of output signals that is decoded to drive a third plurality of equivalent segments.

12. The clock delay circuit of claim 11 wherein each of the second plurality equivalent segments comprises a weight with respect to the output signal that is greater than a weight with respect to the output signal of the third plurality of segments.

13. The clock delay circuit of claim 11 that is further adapted to introduce a delay between the rise time of the first group of output signals and the second group of output signals that is substantially proportional to an analog propagation delay between a first group of switches driven by the first group of output signals and a second group of switches driven by the second group of output signals.

14. The clock delay circuit of claim 11 that is further adapted to introduce a delay between the rise time of the second group of output signals and the third group of output signals that is substantially proportional to an analog propagation delay between a group of switches driven by the second group of output signals and a group of switches driven by the third group of output signals.

15. A method for reducing glitch impulse in a digital to analog converter, the method comprising:

introducing a delay in the conversion of a selected digital input signal to form a first constituent of an analog output signal, said delay that synchronizes the conversion of the selected digital input signal to a conversion for a second digital input signal to form a second constituent of the analog output signal, said synchronization that reduces the glitch impulse in the analog output signal of the digital to analog converter.

16. The method of claim 15 further comprising setting a magnitude of the delay in proportion to a difference between the analog propagation delay associated with the conversion of the first digital input signal and an analog propagation delay associated with the conversion of the second digital input signal.

17. A method for reducing glitch impulse in a digital to analog converter, the method comprising:

introducing a delay in the conversion of a selected digital input signal to a first portion of an analog output signal, said delay that reduces a time difference between the completion of the conversion of the selected digital input signal to a completion of a conversion for a second digital input signal to a second portion of the analog output signal, said reduction of time difference that reduces the glitch impulse in the digital to analog converter.

18. The method of claim 17 further comprising setting a magnitude of the delay in proportion to a difference between the analog propagation delay associated with the conversion of the first digital signal and an analog propagation delay associated with the conversion of the second digital input signal.

* * * * *